United States Patent [19]

Matsumura et al.

[11] Patent Number: 5,213,850
[45] Date of Patent: May 25, 1993

[54] PROCESS FOR PLATING A METALLIC DEPOSIT BETWEEN FUNCTIONAL PATTERN LINES ON A SUBSTRATE

[75] Inventors: Akira Matsumura, Hirakata; Masashi Ohata, Osaka; Katsukiyo Ishikawa, Kuze, all of Japan

[73] Assignee: Nippon Paint Co., Ltd., Osaka, Japan

[21] Appl. No.: 759,756

[22] Filed: Sep. 12, 1991

Related U.S. Application Data

[63] Continuation of Ser. No. 498,712, Mar. 22, 1990, abandoned.

[30] Foreign Application Priority Data

Mar. 24, 1989 [JP] Japan .................................. 1-73135

[51] Int. Cl.$^5$ ............................................. C23C 26/00
[52] U.S. Cl. ..................... 427/508; 427/437; 427/443.1
[58] Field of Search ................ 427/437, 443.1, 304, 427/305, 306, 302, 438, 508

[56] References Cited

U.S. PATENT DOCUMENTS

| | | | |
|---|---|---|---|
| 4,324,589 | 4/1982 | Gulla | 427/437 |
| 4,383,016 | 5/1983 | Postupack | 427/443.1 |
| 4,440,847 | 4/1984 | Whittemore | 427/302 |
| 4,504,529 | 3/1985 | Sorensen | 427/437 |
| 4,585,502 | 4/1986 | Uozu | 427/302 |
| 4,859,571 | 8/1989 | Cohen | 427/302 |
| 4,915,985 | 4/1990 | Maxfield | 427/302 |
| 4,920,254 | 4/1990 | DeCamp | 427/302 |

OTHER PUBLICATIONS

IBM Technical Disclosure Bulletin, vol. 31, No. 5, Oct. 1988, pp. 370-372, New York, US; "Precatalyzed epoxy formulations for electroless plating".
RCA Technical Notes, No. 768, Apr. 1968, pp. 2-3; R. J. Ryan: "Printed circuit techniques".
Extended Abstracts, The Electrochemical Society, Inc. Fall Meeting Las Vegas, Nevada, Oct. 17th-22nd 1976, vol. 76-2, abstract No. 273; G. Messner: "imaging processes for electrolessly deposited conductors".

Primary Examiner—Shrive Beck
Assistant Examiner—Vi Duong Dang
Attorney, Agent, or Firm—Wenderoth, Lind & Ponack

[57] ABSTRACT

Disclosed is a process for plating a metallic deposit between functional pattern lines on a substrate, comprising (a) forming a cured film containing a catalyst for electroless plating on the substrate, (b) forming functional pattern lines on said cured film, and (c) conducting electroless plating.

6 Claims, No Drawings

PROCESS FOR PLATING A METALLIC DEPOSIT BETWEEN FUNCTIONAL PATTERN LINES ON A SUBSTRATE

This application is a continuation of now abandoned application, Ser. No. 07/498,712 filed on Mar. 22, 1990.

FIELD OF THE INVENTION

The present invention relates to a process for plating a metallic deposit between pattern lines having a specific function (i.e. electric circuit, color filter etc.) on a substrate. More particularly, it relates to a process for plating a metallic thin deposit by electroless plating between pattern lines which work as a color filter suitable for a liquid crystal color display, whereby enhancing screening properties of unnecessary light and other properties.

BACKGROUND OF THE INVENTION

A color filter for a liquid crystal display generally has a thin layer for screening light, called "black stripe", between pattern lines, in order to screen unnecessary light and enhance other properties. This light-screening thin layer is formed by various methods, such as a printing method (e.g. a silk screen method or an offset method), a photolithography method, a spattering method, an etching method of a vapor-deposited metal layer and the like.

It, however, is difficult that the printing method produces pattern lines of less than 100 micron. The photolithography method is more accurate than the printing method, but operating processes are very complicated, so that it is difficult to actually practice the method in view of producibility and producing expense. The etching method has the same problem as the photolithography method, because its operating processes are complicated. The conventional methods also have problems in that it is difficult to precisely form the light-screening thin layer between the circuit pattern lines.

SUMMARY OF THE INVENTION

The present invention provides an improved method for producing a color display. Thus, the present invention provides a process for plating a metallic deposit between functional pattern lines on a substrate, comprising (a) forming a cured film containing a catalyst for electroless plating on the substrate, (b) forming functional pattern lines on said cured film, and (c) conducting electroless plating.

DETAILED DESCRIPTION OF THE INVENTION

The step (a) of the present invention forms on the substrate a cured film which contains the electroless plating catalyst. The substrate used in the present invention includes a plastic plate, a glass plate and the like, but preferred is a transparent glass plate. The electroless plating catalyst can be any catalysts used for electroless plating, but includes palladium, silver, nickel, copper or gold. Preferred is palladium. In the step (a), the only necessary thing is that the catalyst is present in the cured film, so that the cured film can be any one which is used for the coating field. In case where the catalyst is palladium, the cured film can be obtained from a heat- or photo-curable aqueous coating composition. The photocurable aqueous coating composition may be composed of a water soluble polymer and a photosensitizer. Examples of the water soluble polymers are natural polymers, such as gelatin, casein, fish glue and egg albumen; synthetic polymers, such as polyvinyl alcohol, polyvinyl pyrolidone and polyacrylamide; and the like. Examples of the photosensitizers are materials which arises cross-linking reactions with the water soluble polymer, for example dichromates, such as ammonium dichromate, sodium dichromate, potassium dichromate etc.; diazonium salts, such as p-diazophenylamine, 1-diazo-4-dimethylaminobenzene hydrofluoroborate, 1-diazo-3-methyl-4-dimethylaniline sulfate, 1-diazo-3-monoethylnaphthylamind etc. The heatcurable aqueous composition may be composed of a water soluble polymer and a curing agent. Examples of the water soluble polymer is polyester resin, acryl resin and the like. In the aqueous coating composition, palladium chloride is reduced with stannous chloride in the presence of acid to form palladium metal which is functioned as an electroless plating catalyst.

The aqueous coating composition may be applied onto the substrate and then cured by heat or light. An application method and curing conditions are known to the art.

In the step (b), the functional pattern lines are formed on the catalyst containing-cured film of the step (a). The forming method of the functional pattern lines is a printing method (e.g. offset, silk screen etc.), a photolithography method, an electrodeposition-transfer method of Japanese Kokai Publication 22379/1989 and the like. By "functional pattern lines" are meant pattern lines which fulfill various functions, such as electric circuit or color filter. In case of the color filter, the functional pattern lines are generally colored with red, blue or green pigment. It is preferred that the functional pattern lines are cured or crosslinked by heat or light not to remove from the substrate.

In the step (c) of the present invention, electroless plating is conducted in a plating bath to form a metallic deposit between functional pattern lines. The plating solution for electroless plating may be prepared from an electroless nickel plating composition, an electroless nickel alloy plating composition, an electroless cobalt plating composition, an electroless tin plating composition, an electroless gold plating composition and the like, which are known to to art. Electroless plating may be carried out at 5° to 95° C. for 0.1 to 24 hours.

In the present invention, the functional pattern lines is formed on the catalyst containing-cured film, so that the place on which light screening metallic deposit is formed appears, but other places are covered with the pattern line. Accordingly, the metallic deposit is precisely plated on the place to be plated. The process of the present invention is also very simple and easy.

EXAMPLES

The present invention is illustrated by the following Examples which, however, are not construed as limiting the present invention to their details.

Example 1

(1) Step (a)

A aqueous coating composition which contained a catalyst for electroless Ni-P plating was prepared by mixing ingredients shown in Table 1. The composition was applied onto a glass substrate having a thickness of 1.1 mm to form a coating of 0.2 micrometer. The coated film was heated at 80° C. for 10 minutes to dry and then cured by ultraviolet light of 200 mJ/cm$^2$ from an extrahigh pressure mercury lamp (available from Oak Co., Ltd. as Polymer Printer HMW-40-1).

TABLE 1

| Ingredients | Parts by weight |
|---|---|
| Gelatin | 20 |
| Ammonium dichromate | 4 |
| Palladium chloride/stannous chloride colloidal solution[1] | 2 |
| 110 ml/l Hydrochloric acid | 2 |
| Water | 72 |
| Total | 100 |

[1]An aqueous solution of 1.5 g/l of palladium chloride and 100 g/l of stannous chloride (2) Step (a)

Red, blue and green inks for pattern lines were prepared by mixing ingredients shown in Table 2. The color pattern lines were formed on the coated substrate of the step (a) from the three inks by photolithography technique. The pattern lines were cured at 175° C. for 30 minutes and had 1.5 micron thickness.

TABLE 2

| | Parts by weight | | |
|---|---|---|---|
| Ingredients | Blue | Red | Green |
| Polyimide precursor[1] | 357 | 357 | 357 |
| Ethyleneglycol monomethyl ether | 606 | 606 | 606 |
| N-phenyl-γ-aminopropyltrimethoxysilane | 1.4 | 1.4 | 1.4 |
| Phthalocyanine blue | 35.7 | — | — |
| Azo metal salt red pigment | — | 35.7 | — |
| Phthalocyanine green | — | — | 35.7 |
| Total | 1000.0 | 1000.0 | 1000.0 |

[1]IN Methyl pyrolidone solution of polyamic acid (solid content = 20%)

(3) Step (c)

The resultant glass substrate of the step (b) was immersed in an Ni-P electroless plating solution at 70° C. for 30 minutes. The plating solution contained 1 mol/l of nickel sulfate, 2 mol % of ammonia water, 2 mol/l of sodium hypophosphite and 2 mol/l of sodium hydroxide. The immersed substrate was rinsed with water and heated at 80° C. for 10 minutes to obtain a color filter. The color filter had a light screening metallic deposit of 1.3 micrometer which was precisely plated between color pattern lines.

Example 2

The color patterned substrate of step (b) was prepared as generally described in Example 1, with the exception that the color pattern lines were formed by screen printing instead of photolithoraphy technique. The red pattern line had 2.0 micron thickness, the green line had 2.1 micron thickness and the blue line had 2.3 micron thickness.

The resultant glass substrate was immersed in an Ni-P electroless plating solution of Example 1 at 50° C. for one hour. The immersed substrate was rinsed with water and heated at 80° C. for 10 minutes to obtain a color filter. The color filter had a light screening metallic deposit of 1.5 micrometer which was precisely plated between color pattern lines.

Example 3

A color filter was prepared as generally described in Example, with the exception that the aqueous coating composition which contained a catalyst for electroless Ni-P plating was prepared from ingredients shown in Table 3, instead of the ingredients of Table 1. The obtained color filter had a light screening metallic deposit which was precisely plated between color pattern lines.

TABLE 3

| Ingredients | Parts by weight |
|---|---|
| Triethyleneglycol dimethacrylate | 35 |
| 1-(4-Dodecylphenyl)-2-hydroxy-2-methylpropane-1-one | 1 |
| Palladium chloride/stannous chloride colloidal solution[1] | 2 |
| 110 ml/l Hydrochloric acid | 2 |
| Water | 60 |
| Total | 100 |

[1]An aqueous solution of 1.5 g/l of palladium chloride and 100 g/l of stannous chloride

What is claimed is:

1. A process for plating a metallic deposit between color filter pattern lines on a substrate, comprising:
   (a) forming a cured film containing a catalyst for electroless plating on the substrate,
   (b) forming color filter pattern lines on said cured film, and
   (c) conducting electroless plating to form metal deposits between the color filter pattern lines.
2. The process according to claim 1 wherein said substrate is a plastic plate or a glass plate.
3. The process according to claim 1 wherein said catalyst for electroless plating is palladium.
4. The process according to claim 1 wherein said cured film is obtained from a heat- or photo-curable aqueous coating composition.
5. The process according to claim 3 wherein said palladium catalyst is prepared by reducing palladium chloride with stannous chloride in the presence of acid.
6. The process according to claim 1 wherein said color filter pattern lines are prepared by a printing method, a photolithography method or an electrodeposition-transfer method.

* * * * *